US012082359B2

(12) United States Patent
Wang et al.

(10) Patent No.: US 12,082,359 B2
(45) Date of Patent: Sep. 3, 2024

(54) HINGE AND MOBILE TERMINAL HAVING INFOLDING FLEXIBLE SCREEN

(71) Applicant: Hangzhou Amphenol Phoenix Telecom Parts Co., Ltd., Hangzhou (CN)

(72) Inventors: Peisong Wang, Hangzhou (CN); Jingjiang Zhang, Hangzhou (CN); Jingfa Fang, Hangzhou (CN)

(73) Assignee: HANGZHOU AMPHENOL PHOENIX TELECOM PARTS CO., LTD., Hangzhou (CN)

( * ) Notice: Subject to any disclaimer, the term of this patent is extended or adjusted under 35 U.S.C. 154(b) by 0 days.

(21) Appl. No.: 18/264,380

(22) PCT Filed: Jan. 28, 2022

(86) PCT No.: PCT/CN2022/074644
§ 371 (c)(1),
(2) Date: Aug. 4, 2023

(87) PCT Pub. No.: WO2022/166816
PCT Pub. Date: Aug. 11, 2022

(65) Prior Publication Data

US 2024/0040725 A1 Feb. 1, 2024

(30) Foreign Application Priority Data

Feb. 8, 2021 (CN) ......................... 202120372539.5

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC .... G06F 1/1641; G06F 1/1652; G06F 1/1681; H04M 1/022; H04M 1/0268;
(Continued)

(56) References Cited

U.S. PATENT DOCUMENTS 10,070,546 B1 * 9/2018 Hsu ..................... E05D 11/1028
10,761,574 B1 * 9/2020 Hsu ....................... G06F 1/1616
(Continued)

FOREIGN PATENT DOCUMENTS

CN 211239890 U 8/2020
CN 112153174 A 12/2020
(Continued)

*Primary Examiner* — Rockshana D Chowdhury
*Assistant Examiner* — Douglas R Burtner
(74) *Attorney, Agent, or Firm* — MUNCY, GEISSLER, OLDS & LOWE, PC

(57) ABSTRACT

A hinge and a mobile terminal including an infolding flexible screen. A left side structure and a right side structure in the hinge each include a mechanism composed of a push-pull rod and a fixed base, to push/pull a housing connector to slide, a rotation member, a movable guide rail, and a rotation support plate. The rotation member is slidably connected to the housing connector. The movable guide rail and the housing connector synchronously slide and synchronously rotate about the same axis. The inner end of the rotation support plate is a rotation connection end, and the outer end is movably connected to the movable guide rail by means of a shaft pin. Moreover, the movable guide rail provided on a sliding structure combines with the design of each axis.

1 Claim, 4 Drawing Sheets

2
1
11
6
11
1
2
3
71
74
71
3

(58) Field of Classification Search
CPC .. H04M 1/0214; H04M 1/0249; H04M 1/026; H05K 5/0226
See application file for complete search history.

(56) References Cited

U.S. PATENT DOCUMENTS 11,048,296 B2* 6/2021 Hsu ........................ G06F 1/1652
11,129,287 B2* 9/2021 Hsu ........................ H05K 7/1401
11,181,951 B1* 11/2021 Ushioda ................ G06F 1/1616
11,467,633 B2* 10/2022 Liao ........................ F16C 11/04
2015/0241925 A1* 8/2015 Seo ........................ G06F 1/1652 361/679.27
2015/0366089 A1* 12/2015 Park .................... H04M 1/0268 361/679.01
2016/0302314 A1* 10/2016 Bae ........................... G06F 1/16
2019/0098783 A1* 3/2019 Zhang .................. H05K 5/0017
2020/0081495 A1* 3/2020 Lin ........................ G06F 1/1681
2020/0310497 A1* 10/2020 Hsu ............................ E05D 3/18
2020/0355216 A1* 11/2020 Bae ........................ G06F 1/1652
2020/0371553 A1* 11/2020 Hsu ........................ G06F 1/1624
2021/0011513 A1* 1/2021 Watamura ............. G06F 1/1652
2021/0108677 A1* 4/2021 Bae ........................ G06F 1/1681
2021/0181808 A1* 6/2021 Liao ....................... G06F 1/1652
2021/0271294 A1* 9/2021 Liao ....................... G06F 1/1681
2022/0217228 A1* 7/2022 Hu ....................... H04M 1/0216
2022/0247843 A1* 8/2022 Hu ......................... G06F 1/1681
2023/0244274 A1* 8/2023 Lin ........................ G06F 1/1616 361/679.27

FOREIGN PATENT DOCUMENTS

CN 212137727 U 12/2020
CN 214507124 U 10/2021
WO WO2020046025 A2 3/2020

* cited by examiner

HINGE AND MOBILE TERMINAL HAVING INFOLDING FLEXIBLE SCREEN

FIELD OF THE INVENTION

The present invention relates to a hinge and a mobile terminal having an infolding flexible screen using the hinge.

BACKGROUND OF THE INVENTION

Different measures are taken for a mobile terminal having a flexible screen to deal with the bulging shape of the bending part when the flexible screen is folded. A measure is to provide a rotating plate in the middle to avoid, so that the folded middle seam can be straight, and the folded middle part of the flexible screen is similar to a droplet shape. In order to realize the hinge structure with this measure, the narrow border design of the mobile terminal having an infolding flexible screen will be restricted.

SUMMARY OF THE INVENTION

An object of the present invention is to provide a new solution for the problems existing in the background art, which can be applied to a mobile terminal having an infolding flexible screen, to realize the avoidance requirements of a droplet shape, and meet the requirements of narrow frame and thin shape of the mobile terminal. In order to achieve this object, the present invention adopts the following technical solutions:

A hinge, comprising a left side structure and a right side structure, wherein the left side structure and the right side structure each comprise:

- a mechanism composed of a push-pull rod and a fixed base and configured to push/pull a housing connector to slide;
- a rotation member, the rotation member is slidably connected to a housing connector, the sliding direction is perpendicular to a rotation axis of the rotation member, and the housing connector and the rotation member synchronously rotate about the same axis;
- a movable guide rail, the movable guide rail and the housing connector synchronously slide and synchronously rotate about the same axis;
- a rotation support plate, configured to support the flexible screen at a position close to the middle part when a mobile terminal having a flexible screen is unfolded, and avoid a bulging part of the flexible screen when the mobile terminal with a flexible screen is in a folded state; the inner end of the rotation support plate is a rotation connection end, and the outer end is movably connected to the movable guide rail by means of a shaft pin;
- the hinge further comprises a synchronous reverse rotation connecting structure, which is connected between the left side structure and the right side structure, such that the rotation members of the left side structure and the right side structure rotate synchronously and reversely.

The hinge is a hinge applied to a mobile terminal having an infolding flexible screen.

Further, the inner side of the rotation support plate is rotatably connected to the fixed base.

Further, the housing connector is rotatably connected to the push-pull rod, and the push-pull rod is rotatably connected to the fixed base; the push-pull rod adopts the structure of a circular arc sliding block and a circular arc guide rail and is rotatably connected to the fixed base, and the rotation axis is higher than the height of the back of the flexible screen when the mobile terminal having a flexible screen is unfolded.

Further, the movable guide rail is fixed with the housing connector.

Further, the high is further provided with an operation feedback mechanism; the operation feedback mechanism comprises: a first rotating cam provided in the inner end of the rotation member at the front and rear ends along the axis of rotation, a second sliding cam that match with the first rotating cam at the front and rear ends, wherein the second sliding cam is supported by a spring to be close to the first rotating cam, and cam matching structures at the front end and the rear end are symmetrically the same.

Another object of the present invention is to provide a mobile terminal having an infolding flexible screen using the hinge, which is capable of avoiding the droplet-shape bending part of the flexible screen, and meeting the requirements for narrow frame and thin shape. For this reason, the present invention adopts the following technical solutions:

A mobile terminal having an infolding flexible screen, comprising a left housing, a right housing and an inner flexible screen, wherein the mobile terminal having an infolding flexible screen further comprises the hinge, the housing connectors of the left side structure and the right side structure are fixedly connected with the left housing and the right housing respectively, the left housing and the right housing synchronously rotate and synchronously slide with the housing connectors of the left side structure and the right side structure respectively;

Taking an unfolded state of the mobile terminal having an infolding flexible screen as a reference state, the rotation members of the left side structure and the right side structure, the rotation support plate, and the mechanism that pushes and pulls the housing connector to slide are arranged below the inner flexible screen; wherein the fixed base and the synchronous reverse rotation connection structure are arranged in the middle housing between the left housing and the right housing, in the left side structure, the rotation axis of the rotation support plate is higher that of the rotation member, and is more to the left than the rotation axis of the rotation member, in the right side structure, the rotation axis of the rotation support plate is higher than that of the rotation member, and is more to the right than the rotation axis of the rotation member.

Due to the adoption of the technical solutions herein, the present invention can be applied to a mobile terminal having an infolding flexible screen; the avoidance requirements of a droplet shape can be realized, the narrowest design of a frame can also be realized. Moreover, the movable guide rail provided on a sliding structure can be used in combination with the design of each axis, such that the curvature of a guide groove in the movable guide rail is smaller, and the thickness of the mobile terminal is reduced.

DETAILED DESCRIPTION

Figure 1:
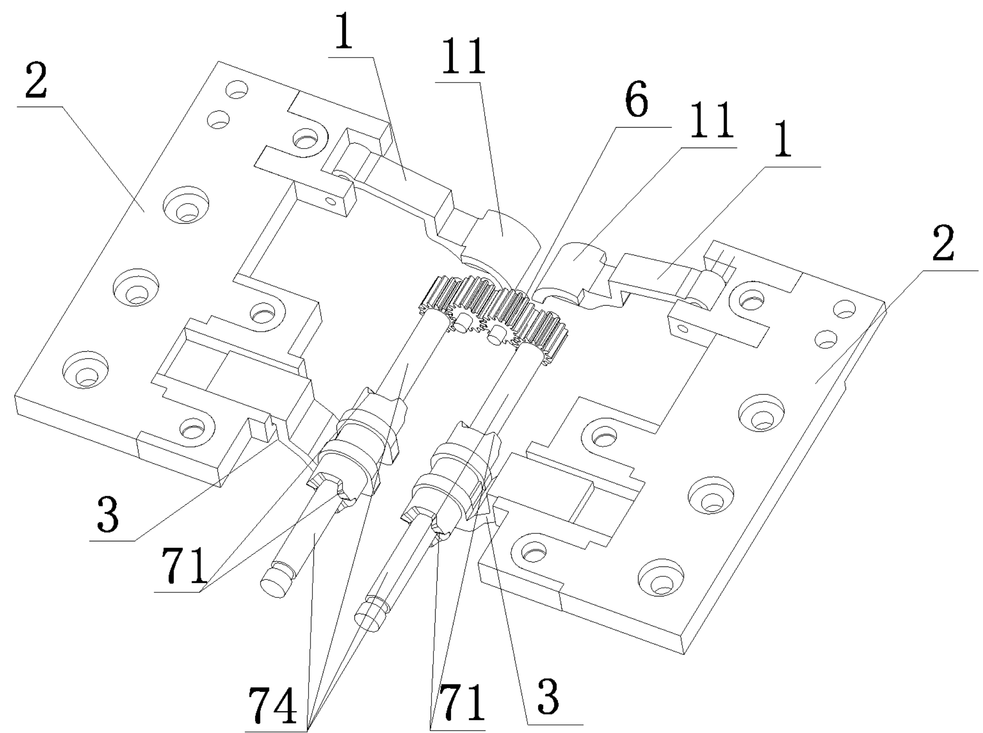
FIG. 1 is a schematic diagram of a hinge according to an embodiment of the present invention.
Figure 2:
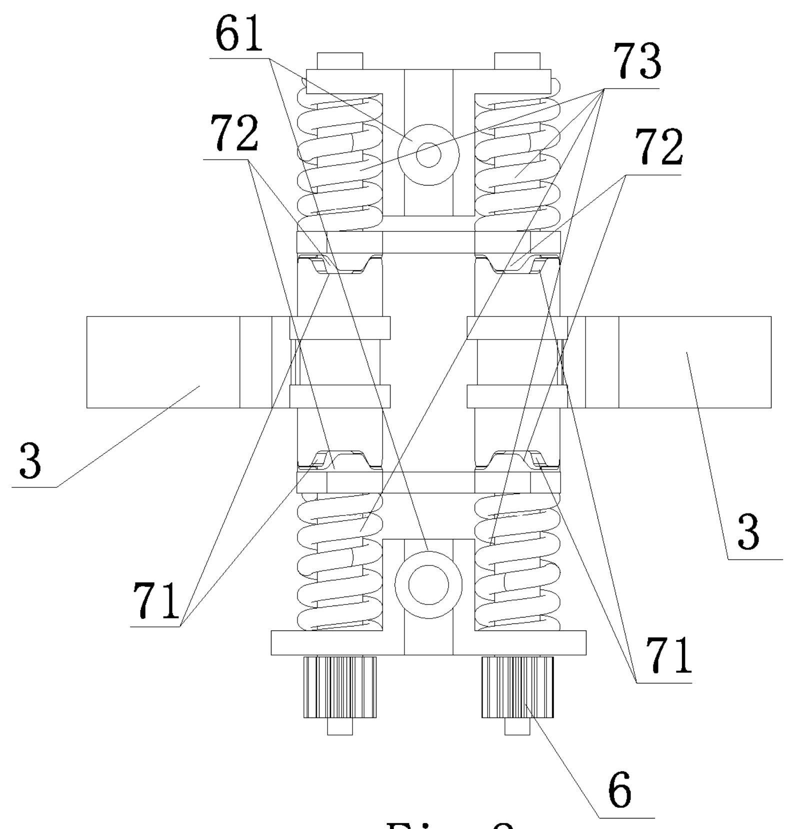
FIG. 2 is a schematic diagram of an operation feedback mechanism of a hinge according to an embodiment of the present invention.
Figure 3:
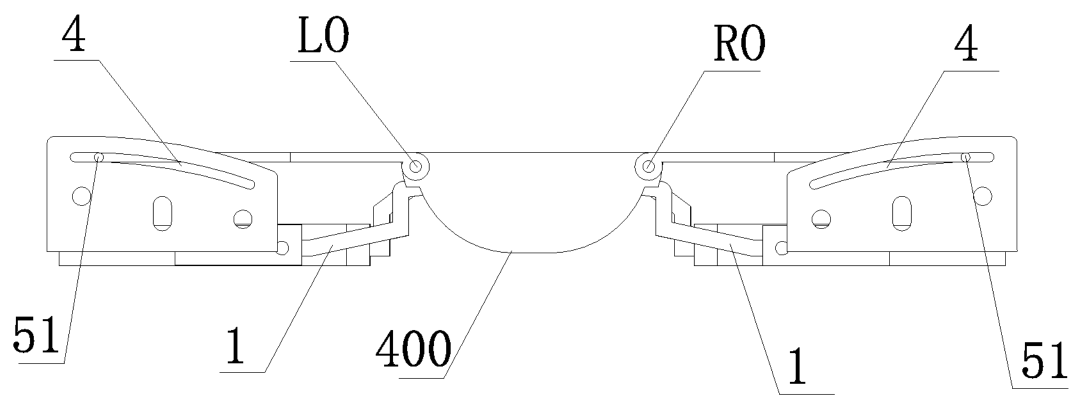
FIG. 3 is a front view of a partial structure of a mobile terminal having an infolding flexible screen in an unfolded state according to an embodiment of the present invention.
Figure 4:
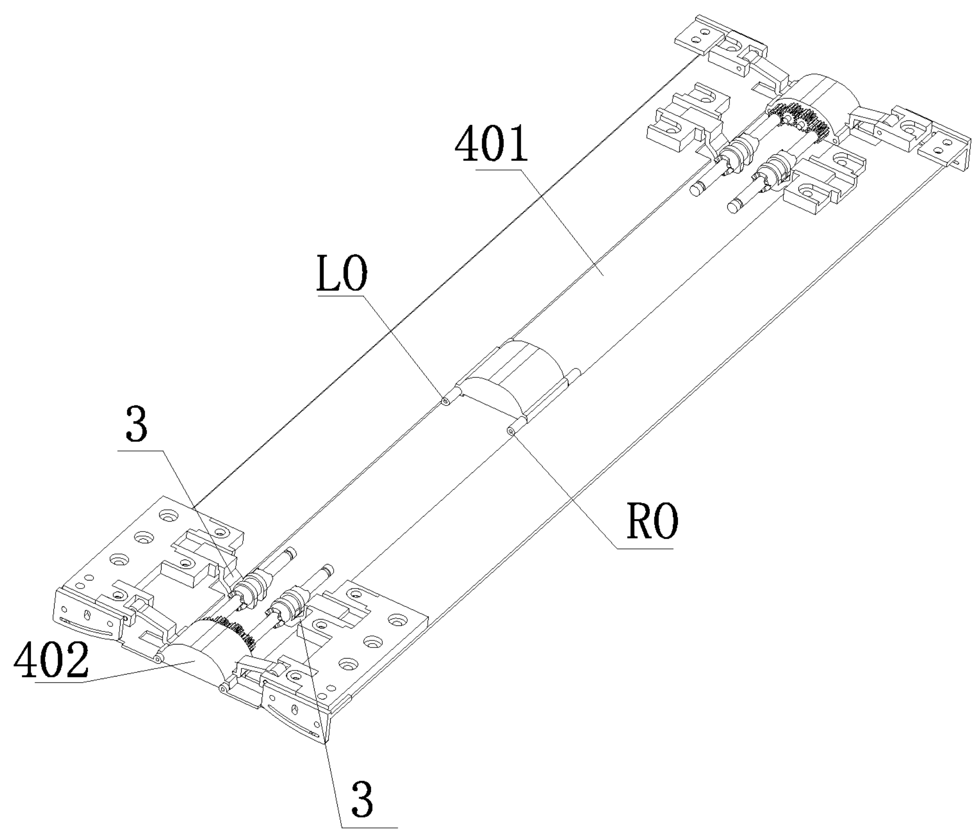
FIG. 4 is a perspective view of a partial structure of a mobile terminal having an infolding flexible screen in an unfolded state according to an embodiment of the present invention.
Figure 5:
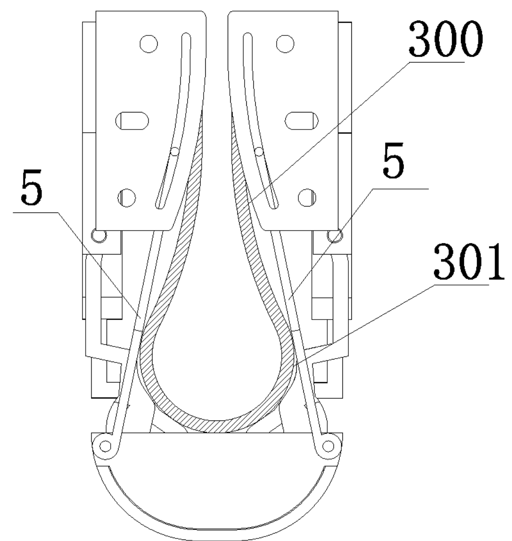
FIG. 5 is a front view of a partial structure of a mobile terminal having an infolding flexible screen in a folded state according to an embodiment of the present invention.
Figure 6:
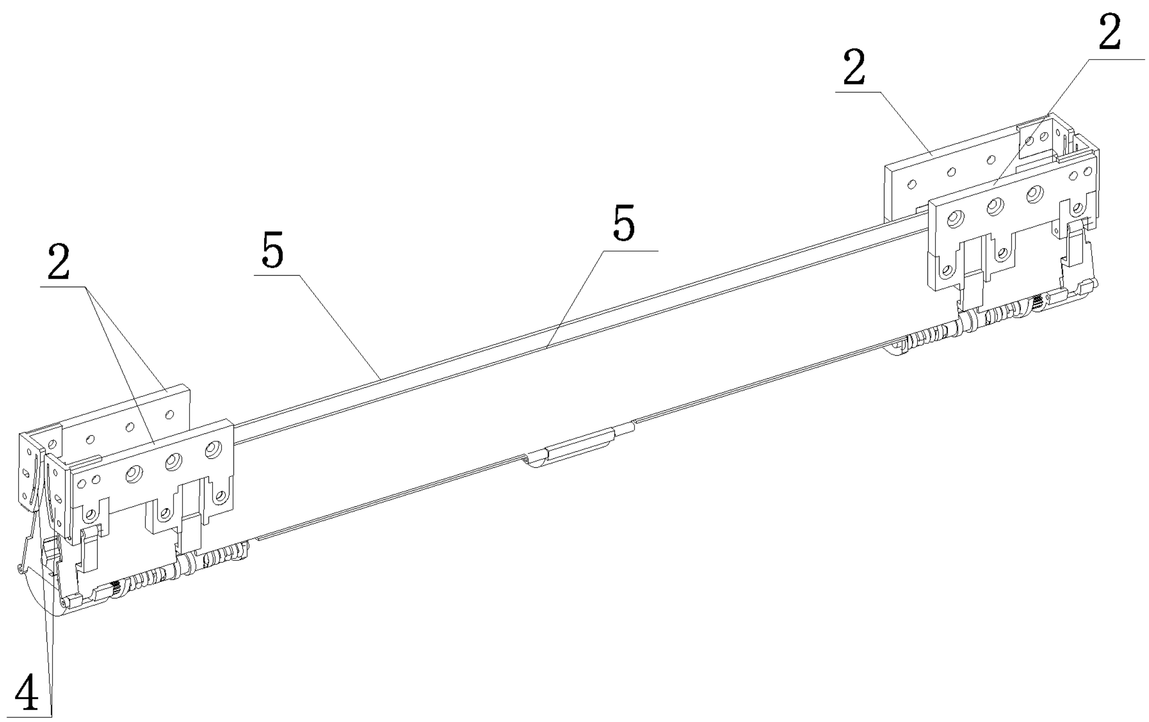
FIG. 6 is a perspective view of a partial structure of a mobile terminal having an infolding flexible screen in a folded state according to an embodiment of the present invention.
Figure 7:
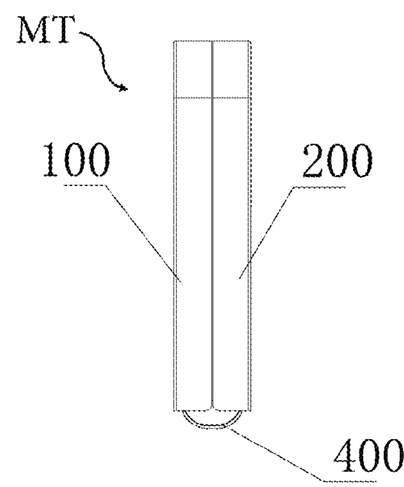
FIG. 7 is a side view of a mobile terminal having an infolding flexible screen in a folded state according to an embodiment of the present invention.
Figure 8:
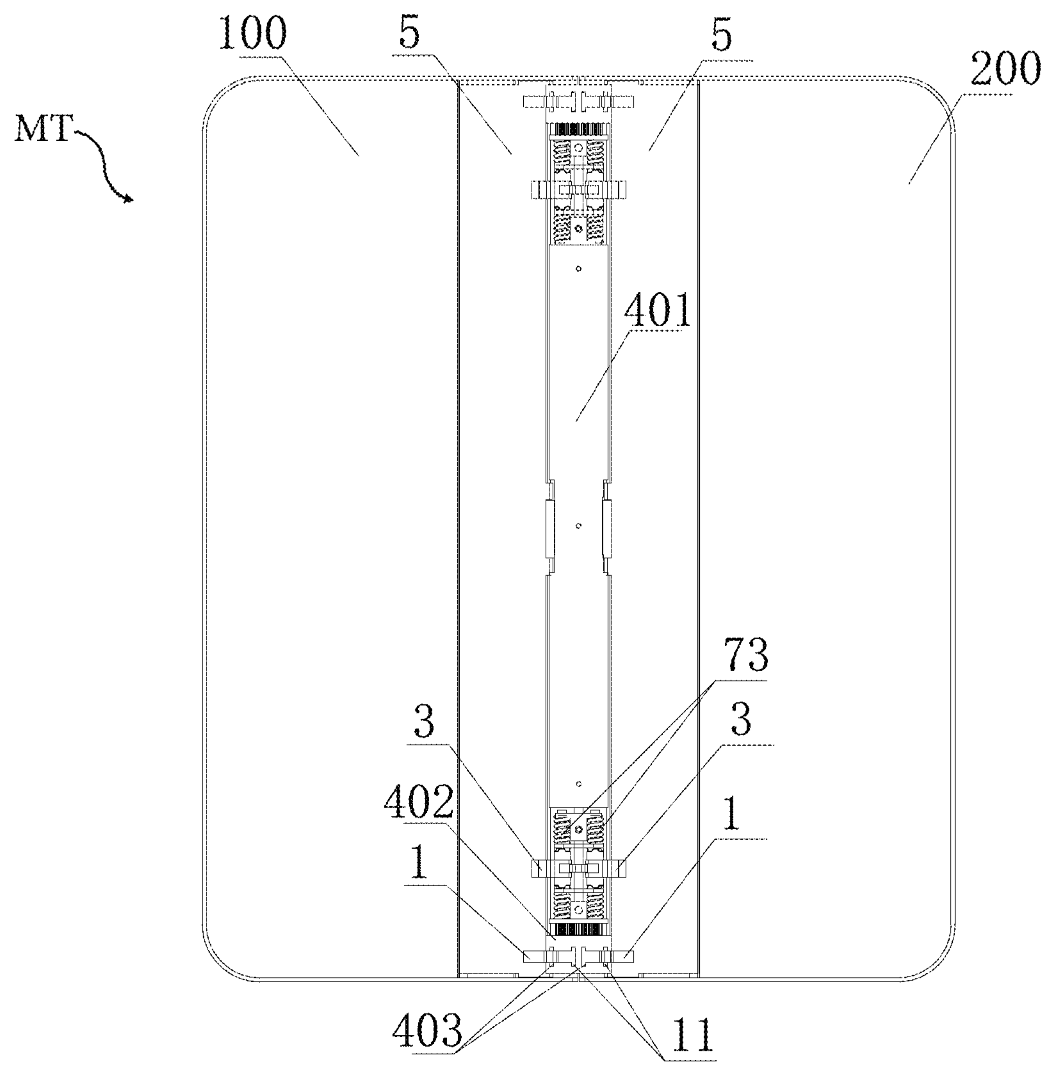
FIG. 8 is a top view of a mobile terminal having an infolding flexible screen in an unfolded state according to an embodiment of the present invention.

Referring to the accompanying drawings, a hinge provided in the present invention comprises a left side structure and a right side structure, wherein the left side structure and the right side structure each comprise:

a mechanism comprising a push-pull rod 1 and a fixed base 402 that push and pull the housing connector 2 to slide, which is arranged below the inner flexible screen 300 by taking an unfolded state of the mobile terminal MT having an infolding flexible screen as a reference state; When the mobile terminal MT having an infolding flexible screen rotates from the unfolded state to the folded state, the push-pull rod 1 pushes the housing connector 2 outwardly, and when the mobile terminal MT having an infolding flexible screen rotates from the folded state to the unfolded state, the push-pull rod 1 pulls the housing connector 2 inwardly;

A rotation member 3, which is arranged below the infolding flexible screen 300 by taking an unfolded state of the mobile terminal MT having an infolding flexible screen as a reference state; the rotation member 3 is slidably connected to the housing connector 2, and the sliding direction is perpendicular to the rotation axis of the rotation member 3; a sliding guide structure may be provided between the rotation member 3 and the housing connector 2, and the housing connector 2 and the rotation member synchronously rotate about the same axis, i.e. the housing connector 2 is a slidable and rotatable component. The mobile terminal MT having an infolding flexible screen comprises a left housing 100, a right housing 200 and an inner flexible screen 300, and the housing connectors 2 of the left side structure and right side structure are fixedly connected to the left housing 100 and right housing 200 respectively, such that the left housing 100, the right housing 200 synchronously rotate and synchronously slide with the housing connectors 2 of the left side structure and the right side structure respectively;

A movable guide rail 4, which is arranged on the side of the hinge, or arranged below the infolding flexible screen 300 by taking an unfolded state of the mobile terminal MT having an infolding flexible screen as a reference state; the movable guide rail 4 and the housing connector 2 synchronously slide and synchronously rotate about the same axis, and are slidable and rotatable components, which can be realized by being fixed together with the housing connector 2, since the left housing 100 and right housing 200 are connected to the housing connector 2 respectively; therefore, the movable guide rails 4 on the left and right sides can also be combined with the left housing 100 and the right housing 200 respectively to obtain the motion performance. The shape of the guide groove in the movable guide rail 4 can be an arc-shaped groove;

a rotation support plate 5, which is arrange below the infolding flexible screen 300 by taking an unfolded state of the mobile terminal MT having an infolding flexible screen as a reference state; the rotation support plates 5 of the left side structure and the right side structure are respectively located on the left and right sides of the middle support plate 401 of the mobile terminal MT having an infolding flexible screen respectively by taking an unfolded state of the mobile terminal MT having an infolding flexible screen as a reference state. The middle support plate 401 is arranged at the upward opening of the middle housing 400 of the mobile terminal MT having an infolding flexible screen (taking an unfolded state of the mobile terminal MT having an infolding flexible screen as a reference state), which is configured to support the flexible screen 300 near the middle part when the mobile terminal MT having an infolding flexible screen is unfolded, and avoid the middle bulging part 301 of the flexible screen 300 by rotating at a certain angle when the mobile terminal MT having an infolding flexible screen is in a folded state; The outer end of the rotation support plate 5 is movably connected to the movable guide rail 4 by means of a shaft pin 51, which is capable of moving along the guide groove in the movable guide rail 4. The inner end of the rotation support plate 5 is a rotation connection end, which can be rotatably connected with the fixed base 402, or rotatably connected with the middle housing 400 directly, or rotatably connected with other fixed parts in the middle housing 400.

One end of the rotation support plate 5 is rotatably connected, so this end is fixed to rotate; the other end of the rotation support plate slides in the guide groove of the movable guide rail 4, and the movable guide rail 4 is finally fixed on the housing, so the rotation support plate 5 is equivalent to slide on the housing, slide and rotate following the folding and unfolding processes of the housing, finally achieving the function of protecting the flexible screen. As mentioned above, the rotation center of one end of the rotation support plate 5 is fixed, which can effectively realize the stability of the rotation support plate 5 during the rotation process; the other end slides along with the rotation of the housing, thereby realizing the protection of the droplet-shaped infolding flexible screen. Through the above structure, in fact, almost all the control structures related to the rotation support plate 5 are arranged below the flexible screen 300; even though the movable guide rail 4 is on the side, only the movable guide rail is outside the flexible screen; since the movable guide rail 4 can be directly manufactured with a thinner plate, which can be hidden by the narrow frame of the housing, the narrow frame of the end product can be realized; Furthermore, the curvature of the guide groove in movable guide rail 4 is more flat, which reduces the limit on the thickness of the mobile terminal having an infolding flexible screen and facilitates the thin design.

Returning to the mechanism that pushes and pulls the housing connector 2 to slide, the housing connector 2 is rotatably connected to the push-pull rod 1, and the push-pull rod 1 is rotatably connected to the fixed base 402; the fixed base 402 is fixed in the middle housing.

The push-pull rod 1 adopts the structure of the arc sliding block 11 and the arc guide rail 403 to be rotatably connected with the fixed base 402, and the rotation axis is higher than the height of the back of the flexible screen when the flexible screen mobile terminal is unfolded. By adopting this virtual rotating shaft structure, the following axis arrangement can be more easily realized without limiting the thickness of the mobile terminal having an infolding flexible screen.

The inner ends of the rotation members 3 of the left side structure and the right side structure are connected by a synchronous reverse rotation connection structure to rotate synchronously and reversely, thus the left housing 100 and the right housing 200 also rotate synchronously and reversely.

The synchronous reverse rotation connection structure can adopt a gear meshing connection structure 6.

The hinge is also provided with an operation feedback mechanism, which is intended to provide an operation feedback feel. The operation feedback mechanism comprises: a first rotating cam 71 provided in the inner end of the rotation member 3 at the front and rear ends along the axis of rotation, a second sliding cam 72 that match with the first rotating cam 71 at the front and rear ends, wherein the second sliding cam 72 is supported by a spring 73 to be close to the first rotating cam 71, and the rotation axis of the rotation member is a gear axis. Thus, the second sliding cam 72 can be sleeved on the guide rod 74 on the same center line as the gear shaft, and the spring 73 can also be sleeved on the guide rod 74. By this way, the cam structure at the front end and the cam matching structure at the rear end can be made to be symmetrical and same, and the spring parameters of the cam structure at the front end and the cam structure at the rear end are consistent, so the two sides of the entire feedback mechanism have formed a symmetrical state, with equal force values on both sides, and the whole is stable and reliable; the entire operation feedback mechanism is fixed on the middle housing 400 through the gear brackets at both ends, so as to ensure that the cam rotation axis coincides with the gear synchronous axis, and ensure the stable coincidence of the operation feedback mechanism and the synchronous reverse rotation connection structure of the gear, thereby improving the stability of the torque rotation of the whole machine;

As described above, the fixed base 402 and the synchronous reverse rotation connection structure are arranged in the middle housing 400; by taking an unfolded state of a mobile terminal having an infolding flexible screen as the reference state, in the left side structure, the rotation axis LO of the rotation support plate 5 is higher that of the rotation member 3 (i.e. the axis of the gear connected to the left rotation member 3), and is more to the left than the rotation axis of the rotation member 3, in the right side structure, the rotation axis RO of the rotation support plate 3 is higher than that of the rotation member 3 (i.e. the axis of the gear connected to the right rotation member 3), and is more to the right than the rotation axis of the rotation member 3.

The description only describes the specific embodiments of the present invention, but the structural features of the present invention are not limited thereto. Any changes or modifications made by those skilled in the art within the field of the present invention shall fall within the scope of protection of the present invention.

It should be noted that the terms "comprising" and "having" in the description and claims of the present invention and the accompanying drawings, as well as any modifications thereof, are intended to cover non-exclusive inclusion. The terms "installed/mounted", "arranged", "set", "connected", "sleeved" should be construed broadly. For example, it may be a fixed connection, a detachable connection, or an integral structure; it may be a mechanical connection, or an electrical connection; it may be directly connected, or indirectly connected through an intermediary, or between two devices, elements, or internal communication between components. For those of ordinary skill in the art, the specific meanings of the above terms in the present invention can be understood according to specific situations.

It should be understood that, in the description of the present invention, the orientation or positional relationship indicated by the terms "one end", "another end", "outside", "inside", "horizontal", "end", "length", "outer end", "left", "right", etc. is based on the orientation or positional relationship shown in the figures, and is only for the convenience of describing the present invention and simplifying the description, rather than indicating or implying that the indicated device or element must have the particular orientation, construction and operation in the particular orientation, therefore, it cannot be construed as limitations of the present invention. The terms "first", "second" are used for brevity of description only, and do not indicate or imply relative importance.

The invention claimed is:

1. A mobile terminal, comprising:

a left housing;

a right housing;

an infolding flexible screen; and a hinge, wherein the hinge comprises a left side structure and a right side structure, wherein the left side structure and the right side structure each comprises:

a mechanism composed of a push-pull rod and a fixed base and configured to push/pull a housing connector to slide;

a rotation member slidably connected to the housing connector, wherein a sliding direction is perpendicular to a rotation axis of the rotation member, and the housing connector and the rotation member synchronously rotate about a same axis;

a movable guide rail, the movable guide rail and the housing connector synchronously slide and synchronously rotate about the same axis; and a rotation support plate, configured to support the infolding flexible screen at a position close to a middle part when a mobile terminal is unfolded, and avoid a bulging part of the infolding flexible screen when the mobile terminal is in a folded state, an inner end of the rotation support plate is a rotation connection end, and an outer end is movably connected to the movable guide rail by means of a shaft pin, wherein the hinge further comprises a synchronous reverse rotation connecting structure connected between the left side structure and the right side structure, such that the rotation members of the left side structure and the right side structure rotate synchronously and reversely, the housing connectors of the left side structure and the right side structure are fixedly connected with the left housing and the right housing respectively, the left housing and the right housing synchronously rotate and synchronously slide with the housing connectors of the left side structure and the right side structure respectively, taking an unfolded state of the mobile terminal as a reference state, the rotation members of the left side structure and the right side structure, the rotation support plate, and the mechanism that pushes and pulls the housing connector to slide are arranged below the infolding flexible screen, wherein the fixed base and the synchronous reverse rotation connection structure are arranged in a middle housing between the left housing and the right housing, in the left side structure, a rotation axis of the rotation support plate is higher than the rotation axis of the rotation member, and is more to a left than the rotation axis of the rotation member, in the right side structure, a rotation axis of the rotation support plate is higher than the rotation axis of the rotation member, and is more to a right than the rotation axis of the rotation member.

* * * * *